United States Patent [19]

Lau et al.

[11] Patent Number: 5,514,899
[45] Date of Patent: May 7, 1996

[54] DUAL-EMITTER LATERAL MAGNETOMETER

[75] Inventors: Jack Lau, San Francisco; Christopher C. T. Nguyen, San Jose, both of Calif.; Ping Ko; Philip C. Chan, both of Kowloon, all of Hong Kong

[73] Assignees: Hong Kong University of Science and Technology; R and D Corporation Limited, both of Hong Kong

[21] Appl. No.: 241,407

[22] Filed: May 11, 1994

[51] Int. Cl.$^6$ .......................... H01L 27/22; H01L 29/82; H01L 43/04
[52] U.S. Cl. .......................... 257/423; 257/426; 257/427
[58] Field of Search .......................... 257/421, 423, 257/426, 427

[56] References Cited

U.S. PATENT DOCUMENTS 4,520,413  5/1985  Pictrowski .......................... 257/421
4,999,692  3/1991  Ristic et al. .......................... 257/423
5,099,298  3/1992  Nakamura et al. .......................... 257/423

OTHER PUBLICATIONS

Cristoloveanu et al. "Magneto Diodes . . . Magnetic Sensors" Conf. from Elec. to Microelec. Fourth Euro Conf. on Electro technics Eurocon 80 Stuttgart, Germ. 24–28 Mar. 1980.

*Primary Examiner*—Jerome Jackson
*Attorney, Agent, or Firm*—Burns, Doane, Swecker & Mathis

[57] ABSTRACT

A magnetometer or magnetic field sensor includes semiconductor material deposited laterally on an insulating substrate. The semiconductor material is alternating regions of n- and p-type silicon provided with two cathodes, an anode and a triggering node. Upon application of a triggering pulse to a switch on the sensor, a carrier domain is formed. In the presence of a magnetic field this carrier domain is deflected to one side thus causing an imbalance in the current collected at the two cathodes.

6 Claims, 5 Drawing Sheets

DUAL-EMITTER LATERAL MAGNETOMETER

FIELD OF THE INVENTION

This invention relates to a magnetic field sensor or magnetometer, and in particular to such a sensor formed from semiconductor material and which is compatible with existing integrated circuit manufacturing technologies.

BACKGROUND OF THE INVENTION

Magnetic field sensors and magnetometers have a wide variety of applications. Some examples of their applications are non-contact current sensors, medical imaging and keyboard sensors. A particularly important application is as the read head of magnetic storage units.

When a magnetic field is applied perpendicular to the current trajectory in a piece of material, the moving charge carriers are subject to the Lorentz force. In a semiconductor material, depending on the material and the operating conditions, the Lorentz force manifests itself as one of the following phenomena: the Hall effect, carrier deflection, magnetoconcentration, and magnetoresistance (see for example Baltes et al, "Integrated Semiconductor Magnetic Field Sensors", Proc. 1EEE, Vol 74 No. 8, August 1986, pp. 1107–1132). Known magnetic field sensors or magnetometers exploit one or more of these phenomena in various ways.

At present most magnetometers and sensors are made from a hybrid technology and comprise many discrete components on a small board. An integrated magnetometer or sensor that integrates the basic magnetic sensor with signal conditioning and processing circuitry on the same die can potentially provide a better signal-to-noise ratio, and thus higher sensitivity, and more intelligence than the hybrid magnetometers. Higher sensitivity and faster processing electronics are considered to be necessary to keep up with the advances in magnetic recording technology, and the success of integrating magnetic sensors will be essential for the continued use of the magnetic medium as a low cost, high-density, reliable data storage system, and also for various other applications. The following is a survey of representative known magnetometers and magnetic field sensors.

RELATED ART

Figure 1A:
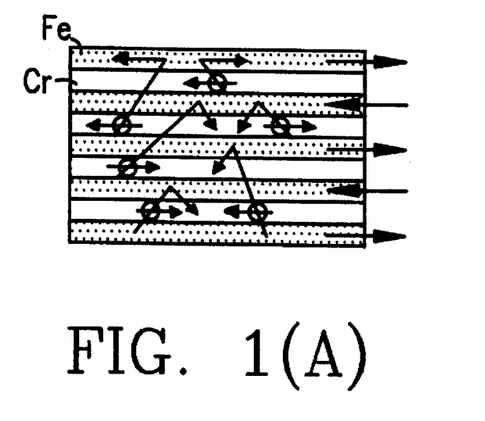
FIG. 1(a) and (b) are schematic views illustrating the giant magnetoresistive effect as conventionally employed.
Figure 1B:
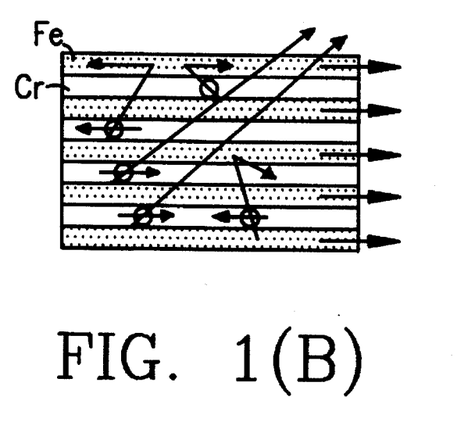

Giant magnetoresistance (GMR) was first reported in 1988: Baibich et al, Phys. Rev. Lett., 61. 2472. GMR has quickly become a preferred method for magnetic read heads. The giant magnetoresistive effect appears in a number of ultra-thin multilayer systems in which thin magnetic films, a few tens of Angstroms thick, are seperated by non-magnetic metal films, also of the order of a few tens of Angstroms thick. Fe and Cr are commonly used as the alternating magnetic and non-magnetic layers. FIGS. 1(a) and 1(b) illustrate the GMR effect. When no magnetic field is applied (FIG. 1(a)) to the multilayer structure, the relative spin orientation of the layers are anti-parallel to each other, whereas when a magnetic field is applied (FIG. 1 (b)) the relative spin orientations of the layers are parallel to each other. When the relative spin is anti-parallel, scattering is strong and effective and no electron can travel more than two layers, making the multilayer material highly resisitive. However when the relative spin is parallel, scattering is weak making the material much more conductive since it is possible for at least some of the electrons to traverse the whole structure. The GMR effect produces a very sensitive magnetic sensor, but the response of the sensor is a non-linear step-like function since, as the magnetic field increases, the sensor effectively switches between a non-conducting and a conducting condition. This means that while the sensor can be used in applications where all that is required is to detect the presence or otherwise of a magnetic field, for example in digital techniques, the sensor cannot be used to measure the actual field strength. Another disadvantage of the GMR technique is that it cannot be properly integrated with an IC circuit.

Figure 2:
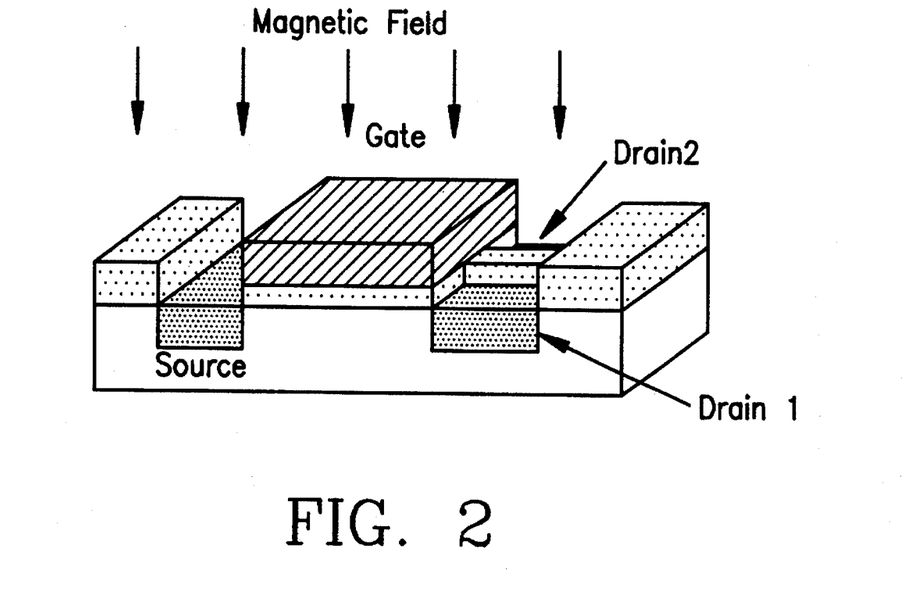
FIG. 2 illustrates a known split-drain MOSFET sensor.

An earlier known magnetic sensor comprises a split-drain MOSFET, first proposed in 1969: P. W. Fry et. al, "A Silicon MOS Magnetic Field Transducer of High Sensitivity", 1EEE Transactions on Electron Devices, Vol. 16 No. 1, January 1969, pp35–38. FIG. 2 illustrates such a sensor. When the drain of a MOS transistor is split into two, the transistor can act as a magnetic field sensor. Based on a combination of the Hall effect and Lorentz deflection, the fractional change of drain current is linearly proportional to the magnetic field strength: J. Lau, P. Ko, P. Chan, "On the Modelling of a CMOS Magnetic Sensor", 1EEE International Symposium of Circuits and Systems, 1994. It can be shown that as much as 3.7% of the total current is changed when a 1 Tesla magnetic field is applied on a 100 µm/100 µm device. The use of a modified MOSFET as a magnetic field sensor is appealing because it is completely compatible with integrated circuit fabrication. However the pure split-drain MOSFET suffers from low sensitivity and is therefore not very useful.

Figure 3:
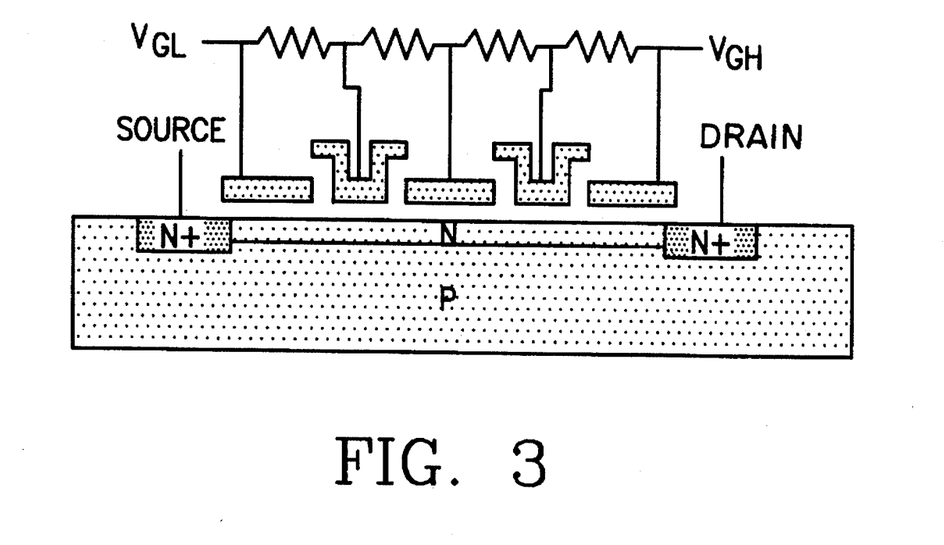
FIG. 3 illustrates a known multiple-gate split-drain MOSFET sensor.

The sensitivity of an ordinary split-drain MOSFET can be greatly enhanced by employing a multiple-gate rather than a single gate: F. J. Kub et al, "Multiple-Gate Split-Drain MOSFET Magnetic Field Sensing Device and Amplifier, Proc. IEEE International Electron Device Meeting, 1992, pp517–520. FIG. 3 shows such an arrangement, the split-drain device is biased at increasingly higher potential from the source to the drain creating an additional longitudinal electric field. With such an arrangement a sensitivity of 18.5% per Tesla is possible.

Figure 4:
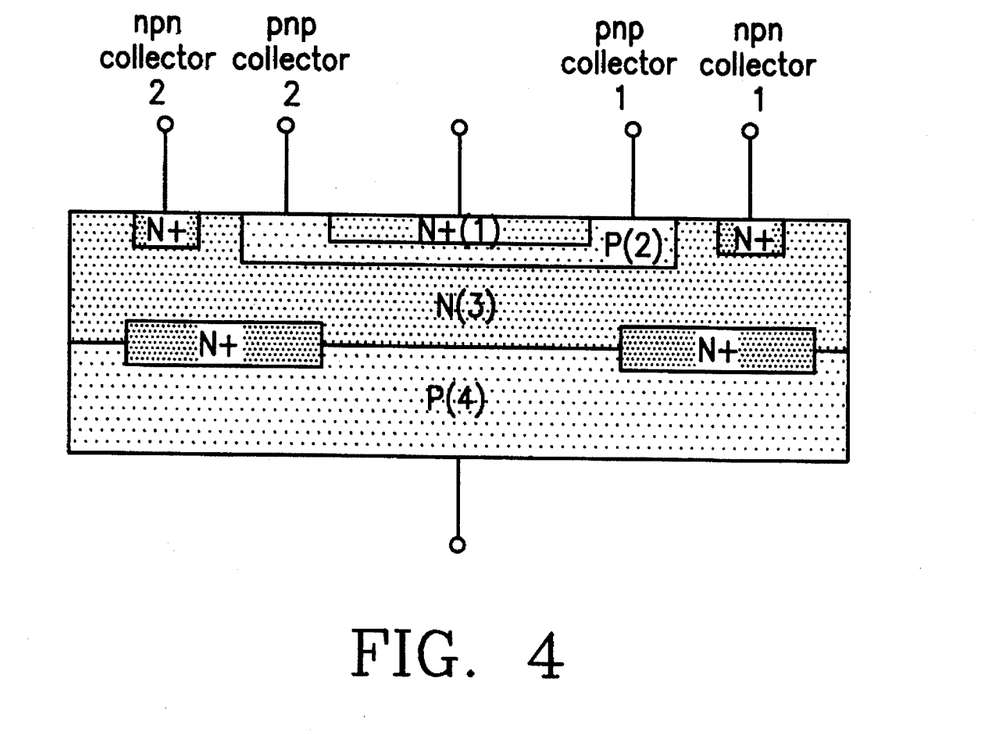
FIG. 4 illustrates a known vertical carrier domain magnetometer.

FIG. 4 shows another magnetic field sensor or magnetometer in the form of a vertical carrier domain magnetometer (CDM), first reported in 1986: J. I. Goicolea, "Design, Theory, and Applications of Integrateable Carrier Domain Magnetometers", PhD Thesis, University of California, Berkeley, December 1986. The vertical CDM achieves a sensitivity of 0.72 µA/Gauss at a 7 mA drive current, making it one of the most sensitive silicon magnetic sensors. Based primarily on carrier deflection, the sensitivity is greatly enhanced because of both the formation of a carrier domain and the built-in positive local feedback. The structure is similar to a npn transistor (regions 1,2 and 3) connected to a pnp transistor (regions 2,3 and 4). The base region of one transistor also acts as the collector of the other. During normal operation, when the carrier of one transistor is collected by the dual collectors the resistance in the collector region creates an uneven lateral potential distribution. This distribution of potential forces the formation of a carder domain with its peak midway between the collectors for both type of carriers. For instance, when holes injected from the emitter of the pnp transistor (region 4) are collected in region 2 by the two pnp collectors, the resistance in region 2 helps create a maximum potential at the center. This maximum potential ensures that when electrons are emitted from the emitter of the npn transistor (region 1) there will be a maximum injection at the center as well. The formation of a carrier domain ensures that a small deflection causes a large change in current as detected by the dual collectors.

The sensitivity of the CDM is further enhanced by the internal positive feedback, since the structure is essentially an npn and a pnp transistor back-to-back, when there is a shift in one of the domains there is an automatic shift in the other domain. For example, a Loreritz deflection may cause the electron domain in region 2 to shift to the right. As this shifted domain traverses through different regions and eventually reaches region 3, some electrons are collected by the n+ collectors and some electrons are lost due to recombination with the holes injected from region 4. With the peak of the electrons being tilted to the right, more holes would be injected from region 4 from the right and thus the hole domain is shifted to the right as well. This process continues as the hole domain goes back to the top and some of them are lost due to recombination with electrons in region 2. Now, since the hole domain is more concentrated in the fight-half plane, more electrons are injected from the right. With the carrier domain thus shifted, the sensitivity of the magnetometer can be characterized at the dual collectors in terms of the imbalance of current flow through them.

Unfortunately, although the making of prototypes is possible, integrating the CDM is hard to do. The fabrication requires modifications of conventional bipolar technology mainly because of the biasing requirements. Since the device is essentially an npn and a pnp transistor back-to-back, the substrate acts as the emitter of the pnp transistor and as such must have a higher voltage than the base and the emitter voltages. If the substrate is tied to ground, then two negative voltages are required for the base and emitter. For protoypes it is possible to connect external power supplies directly to the base and emitter regions, however for integrated applications it is not possible to maintain multiple negative voltages lower than that of the substrate on the chip. A further disadvantage of this vertical CDM is that not all the current entering the device from the anode leaves via the sensing cathode pair, and thus the sensor is inefficient in that a relatively high power and current is required for a desired level of sensitivity.

It will be seen from this summary of the related art that known magnetometers and magnetic field sensors employing semiconductor materials are either not compatible with standard integrated circuit fabrication techniques, or are not sufficiently sensitive for practical usage. Currently, in order to obtain the required sensitivity, materials such as permalloy and superconductors are used. For example a conventional magnetoresistive read head typically uses a permalloy which is about 80% nickel and 20% iron. A small percentage of molybdenum is also used sometimes. There remains a need for a magnetometer or magnetic field sensor employing semiconductor materials of sufficient sensitivity for practical applications and which can be manufactured using standard semiconductor fabrication techniques.

The term "magnetic field sensor" means a device that can detect the existence or otherwise without necessarily being able to measure the strength of that field, while the term "magnetometer" means a device that can measure a magnetic field strength. For convenience, in the remainder of this description the term "magnetic field sensor" alone will be used, but it should be understood that this term is used to additionally embrace the term "magnetometer".

SUMMARY OF THE INVENTION

It is an object of the present invention to provide a magnetic sensor of high sensitivity and which can be fabricated using conventional IC fabrication techniques and therefore can be fully integrated as part of an IC circuit.

According to the present invention there is provided a magnetic sensor formed of semiconductor material deposited laterally on an insulating substrate, comprising a pair of cathodes, an anode and a triggering node, whereby in use a magnetic field is detected as an imbalance between the currents collected at said pair of cathodes.

In a preferred embodiment the sensor has an off-mode and an on-mode, the sensor being switched from said off-mode to said on-mode by the application of a triggering pulse to the triggering node. It is particularly preferred that upon application of the triggering pulse, a carrier domain is formed in the semiconductor material. Preferably after the application of the triggering pulse, the triggering node goes to a high impedance.

With such an apparatus the sensor is "switched on" by the application of a triggering pulse to the triggering node, and when switched on a carrier domain is formed. In this on-mode, in the presence of a magnetic field differential current flow is caused between the two cathodes. This current imbalance can be used not only to sense the presence of a magnetic field, but also to measure its strength. When the sensor is switched on, the triggering node goes to a high impedance and all the current flowing into the sensor through the anode exits the sensor through the two cathodes. This reduces the power demand on the sensor and increases the sensitivity.

Preferably the semiconductor material comprises alternating n-type and p-type semiconductor materials. In a particularly preferred embodiment the semiconductor material is silicon, and the insulating substrate is silicon dioxide.

BRIEF DESCRIPTION OF THE DRAWINGS

The embodiments of the invention will now be described by way of example and with reference to the accompanying drawings, in which.

DETAILED DESCRIPTION THE PREFERRED EMBODIMENTS

Figure 5:
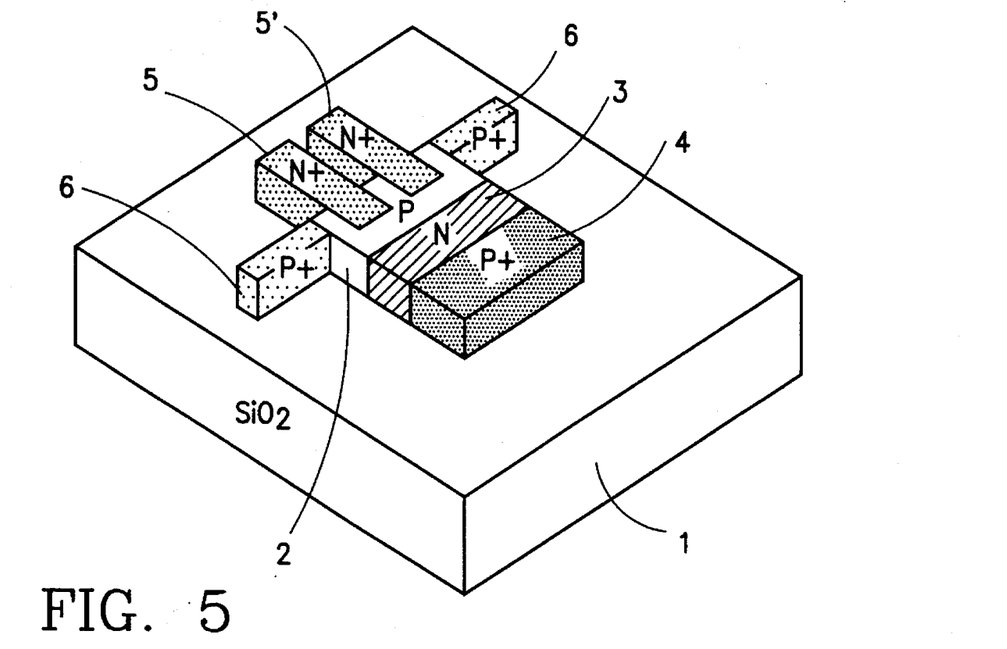
FIG. 5 is a perspective view of a magnetic field sensor according to an embodiment of the present invention.
Figure 6:
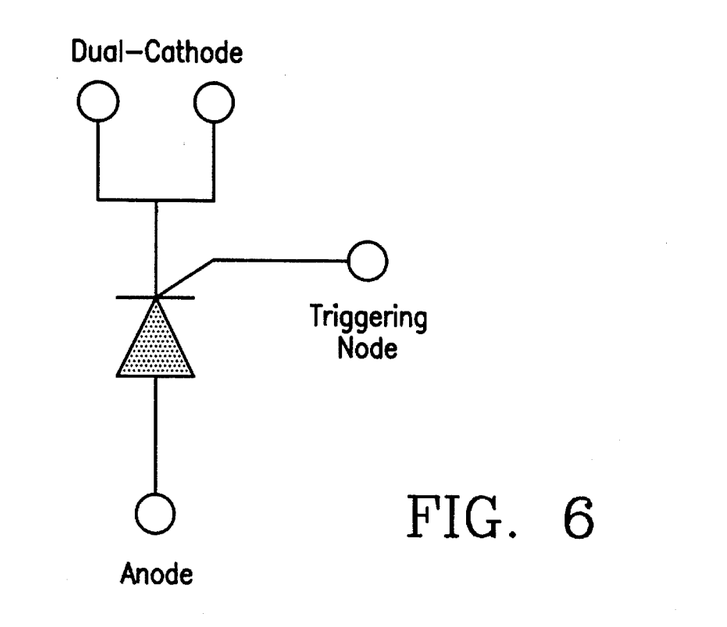
FIG. 6 is a circuit diagram corresponding to the embodiment of FIG. 5, FIGS. 7(a) to (d) show the formation of the carrier domain in the embodiment of FIG. 5, and FIGS. 8(a) to (d) show the shape of the carrier domain at different locations in the magnetic field sensor of the embodiment of FIG. 5.
Figure 7A:
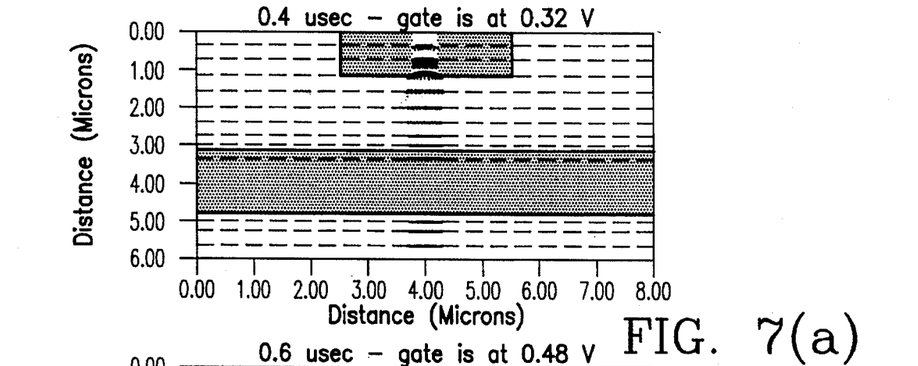
Figure 7B:
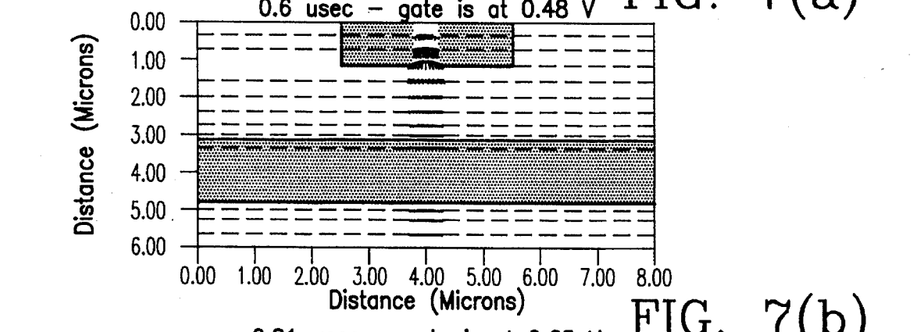
Figure 7C:
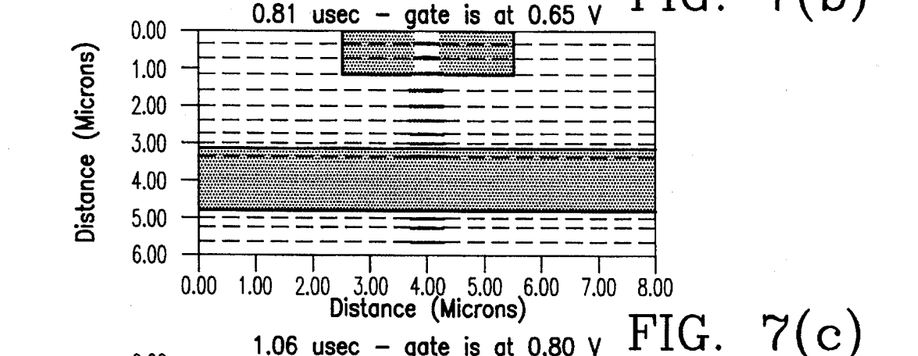
Figure 7D:
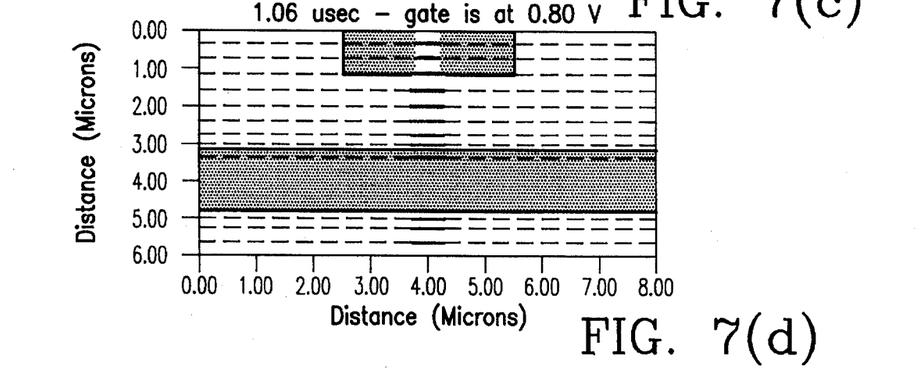
Figure 8A:
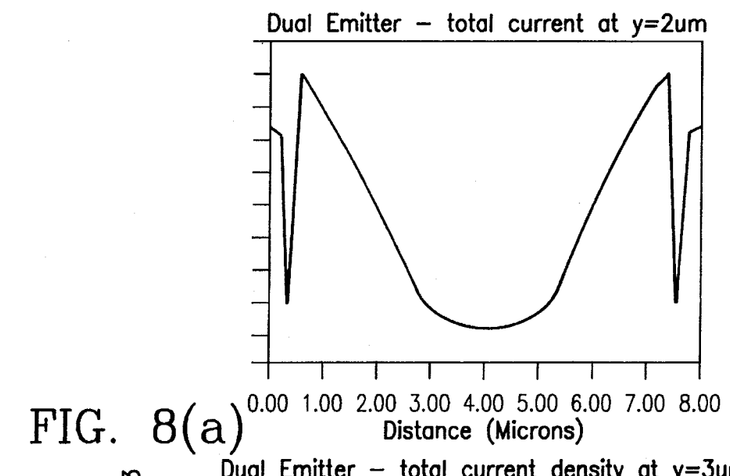
Figure 8B:
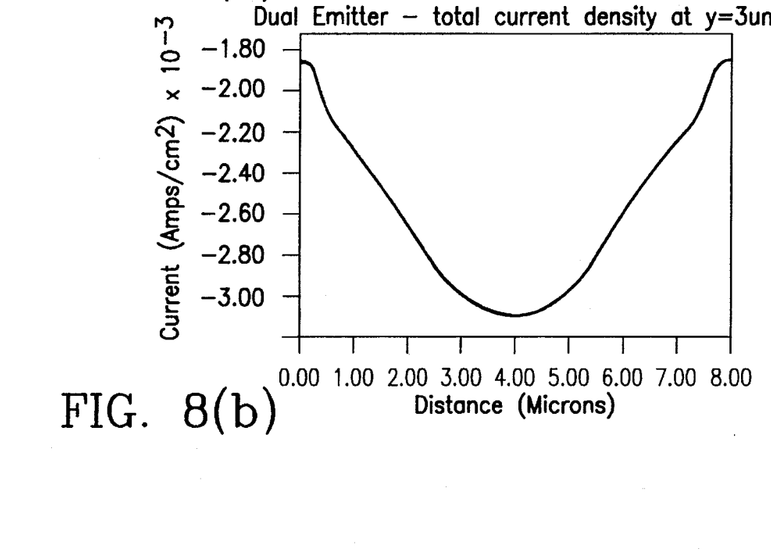
Figure 8C:
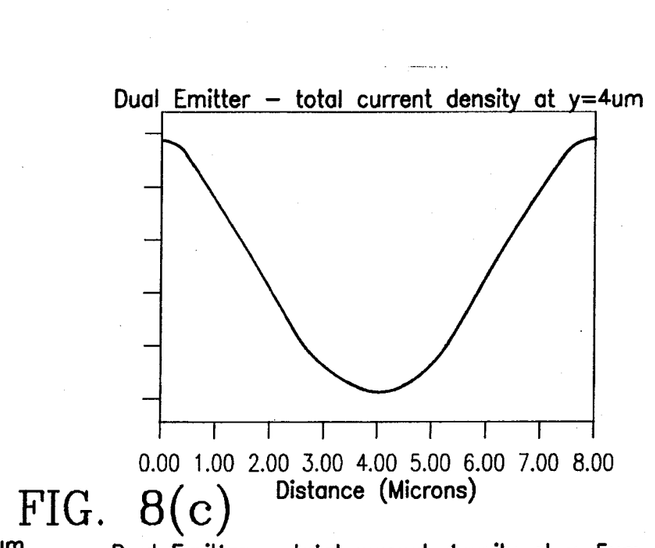
Figure 8D:
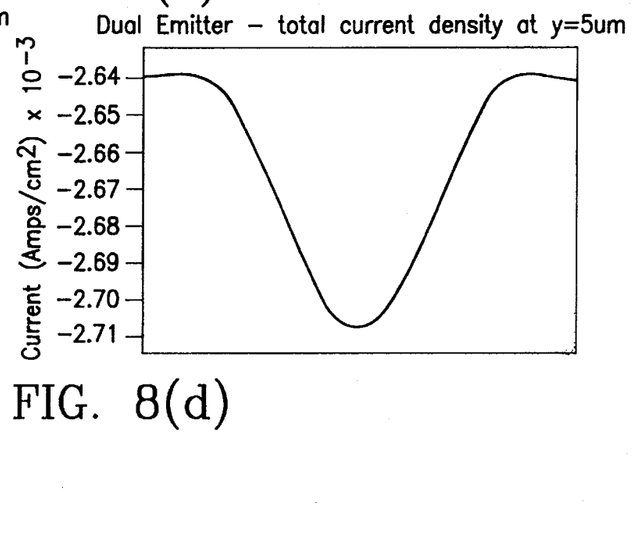

Referring firstly to FIG. 5 there is shown a magnetic sensor according to an embodiment of the present invention. The magnetic field sensor comprises a substrate in the form of a silicon dioxide wafer 1. The operative components of the sensor are formed of silicon semiconductor materials and are deposited on the wafer 1 using conventional integrated circuit fabrication techniques. The operative components include alternating regions of p-type 2 and n-type 3 silicon semiconductor material, a p-type anode 4 adjacent the n-type region 3, a pair of n-type cathodes 5,5' connected to the p-type region 2, and a triggering node 6 comprising two regions of p-type material connected to the sides of the p-type region. As such it will be seen that the structure of the sensor is similar to that of an npn transistor (cathodes 5,5', p-type region 2 and n-type region 3) connected to a pnp transistor (p-type region 2, n-type region 3, and anode 4).

When the sensor is in an off-mode all the nodes (ie the cathodes, anode and triggering node) are at a high impedance. The sensor is switched to an on-mode by the application of a triggering pulse to the triggering node 6. The triggering pulse has a rise time of approximately 1 µs duration and a peak voltage of approximately 0.8 V. While the triggering pulse is being applied, a carrier domain is formed along the central longitudinal axis of the sensor. The formation of this domain over time is illustrated in FIGS. 7(a) to (d), and FIGS. 8(a) to (d) illustrate the shape of the resulting carrier domain as one moves away from the cathodes 5,5'.

After the application of the triggering pulse, the triggering node 6 returns to a high impedance but the carder domain that has been formed remains. In this on-condition the sensor is ready for use. Because the triggering node has returned to a high impedance all current entering the sensor from the anode 4 will leave the sensor through the two cathodes 5,5'.

In the presence of a magnetic field the carder domain will be shifted to one side of the sensor by the effect of Lorentz deflection. This shifting of the carder domain is enhanced by an internal positive feedback. As the electron domain traverses through the different regions from the cathodes to the anode all of them are recombined with holes at the anode which are supplied by injection from the anode. With the electrons shifted to one side from the effect of the Lorentz force, these holes are similarly shifted and as a result the whole current domain is shifted further away from the center.

This shifting of the carrier domain is observed as a differential signal at the cathodes. Under a zero magnetic field the current at both of the cathodes are the same, but under the influence of a magnetic field a difference in the currents is created that is proportional to the strength of the magnetic field.

In contrast to the vertical carrier domain magnetometer of Goicolea, by forming the sensor by lateral deposition of the semiconductor material on an insulating substrate the manufacturing problems associated with the vertical CDM are overcome and the sensor can be manufactured using conventional IC techniques and thus can be fully integrated into an integrated circuit. Furthermore since all the current flowing through the anode must exit one of the cathodes, the sensor can have a high sensitivity at a lower power in comparison with the Goicolea CDM.

It should also be understood that in the sensor of the present invention the cathodes may be anodes, the anode may be cathode, and p-type material may be replaced by n-type and vice versa and the above description and the following claims should be construed accordingly.

We claim:

1. A magnetic sensor formed of semiconductor material deposited laterally on an insulating substrate in the form of a pair of bipolar transistors connected back-to-back, comprising;

a pair of cathodes;

an anode; and a triggering node for switching the sensor from an off-mode to an on-mode in response to a triggering pulse applied thereto so that the sensor may detect a magnetic field as an imbalance between the currents collected at said pair of cathodes.

2. A sensor as claimed in claim 1, wherein a carrier domain is formed in said semiconductor material in response to applying said triggering pulse.

3. A sensor as claimed in claim 1 wherein after application of said triggering pulse, said triggering node goes to a high impedance.

4. A sensor as claimed in claim 1, wherein said semiconductor material comprises silicon.

5. A sensor as claimed in claim 4, wherein said silicon comprises alternating n-type and p-type materials.

6. A sensor as claimed in claim 1, wherein said insulating substrate comprises silicon dioxide.

* * * * *

UNITED STATES PATENT AND TRADEMARK OFFICE
CERTIFICATE OF CORRECTION

PATENT NO. : 5,514,899
DATED : May 7, 1996
INVENTOR(S) : Jack LAU

It is certified that error appears in the above-indentified patent and that said Letters Patent is hereby corrected as shown below:

ON THE TITLE PAGE;

Item [73]:
The name of the sole Assignee is Hong Kong University of Science and Technology R and D Corporation Limited, Hong Kong Signed and Sealed this Thirtieth Day of September, 1997

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,514,899
DATED : May 7, 1996
INVENTOR(S) : Jack LAU

It is certified that error appears in the above-indentified patent and that said Letters Patent is hereby corrected as shown below:

<u>ON THE TITLE PAGE;</u>

Item [73]:
The name of the sole Assignee is Hong Kong University of Science and Technology R and D Corporation Limited , Hong Kong Signed and Sealed this Tenth Day of November 1998

*Attest:*

BRUCE LEHMAN

*Attesting Officer*     *Commissioner of Patents and Trademarks*